(12) United States Patent
Huang

(10) Patent No.: US 10,684,345 B2
(45) Date of Patent: Jun. 16, 2020

(54) RECONSTRUCTING MAGNETIC RESONANCE IMAGES FOR CONTRASTS

(71) Applicant: Shanghai Neusoft Medical Technology Co., Ltd., Shanghai (CN)

(72) Inventor: Feng Huang, Shanghai (CN)

(73) Assignee: Shanghai Neusoft Medical Technology Co., Ltd., Shanghai (CN)

(*) Notice: Subject to any disclaimer, the term of this patent is extended or adjusted under 35 U.S.C. 154(b) by 20 days.

(21) Appl. No.: 16/057,144

(22) Filed: Aug. 7, 2018

(65) Prior Publication Data

US 2019/0041482 A1    Feb. 7, 2019

(30) Foreign Application Priority Data

Aug. 7, 2017    (CN) .......................... 2017 1 0668012

(51) Int. Cl.
| | | |
|---|---|---|
| G01R 33/565 | (2006.01) | |
| G01R 33/56 | (2006.01) | |
| G01R 33/48 | (2006.01) | |
| G01R 33/561 | (2006.01) | |

(52) U.S. Cl.
CPC ... *G01R 33/56545* (2013.01); *G01R 33/4818* (2013.01); *G01R 33/5608* (2013.01); *G01R 33/5611* (2013.01)

(58) Field of Classification Search
CPC .......... G01R 33/4818; G01R 33/56545; G01R 33/5608; G01R 33/5611; G01R 33/5612; G01R 33/5601
USPC ........................................................ 324/309
See application file for complete search history.

(56) References Cited

U.S. PATENT DOCUMENTS

| | | | | |
|---|---|---|---|---|
| 2006/0050981 A1* | 3/2006 | Huang | ............... | G01R 33/5611 |
| | | | | 382/254 |
| 2008/0298661 A1* | 12/2008 | Huang | ............... | G01R 33/5611 |
| | | | | 382/131 |
| 2012/0002858 A1* | 1/2012 | Huang | ............... | G01R 33/5611 |
| | | | | 382/131 |

(Continued)

OTHER PUBLICATIONS

Hee Kwon Song and Lawrence Dougherty, "k-space weighted image contrast (KWIC) for contrast manipulation in projection reconstruction MRI," Magnetic Resonance in Medicine 44(6):825-832; Dec. 2000.

(Continued)

*Primary Examiner* — Patrick Assouad
*Assistant Examiner* — Demetrius R Pretlow
(74) *Attorney, Agent, or Firm* — Fish & Richardson P.C.

(57) ABSTRACT

Methods and devices for reconstructing magnetic resonance images for contrasts are provided. In an example, the method includes: for each channel for each contrast, collecting k-space data of a subject in the channel by scanning the subject in an undersampling manner, collecting central k-space data by scanning a k-space central region of the subject in k-a fullsampling manner, training a convolution kernel of respective phase encoding lines in the channel based on the central k-space data of the contrasts, and obtaining entire k-space data in the channel based on the convolution kernel of respective phase encoding lines in the channel and collected k-space data in the channels, and obtaining a respective magnetic resonance image for each of the contrasts by performing image reconstruction on the entire k-space data in each channel for the contrast.

20 Claims, 3 Drawing Sheets

(56) References Cited

U.S. PATENT DOCUMENTS

| | | | |
|---|---|---|---|
| 2013/0123611 A1* | 5/2013 | Riederer | G01R 33/4818 600/419 |
| 2013/0278263 A1* | 10/2013 | Huang | G01R 33/5611 324/309 |
| 2013/0279786 A1* | 10/2013 | Lin | G01R 33/5611 382/131 |
| 2015/0247910 A1* | 9/2015 | Riederer | G01R 33/4822 324/309 |
| 2016/0132746 A1* | 5/2016 | Saranathan | G06K 9/4633 382/131 |
| 2016/0195597 A1* | 7/2016 | Huang | G01R 33/50 324/309 |
| 2017/0074959 A1* | 3/2017 | Li | G01R 33/5635 |
| 2017/0234952 A1* | 8/2017 | Zhang | G01R 33/4828 324/309 |
| 2017/0336488 A1* | 11/2017 | Pipe | G01R 33/4824 |
| 2019/0113587 A1* | 4/2019 | Paulson | G01R 33/4808 |

OTHER PUBLICATIONS

Griswold, M. et al., "Generalized Autocalibrating Partially Parallel Acquisitions (GRAPPA)," Magnetic Resonance in Medicine 47:1202-1210 (2002).
Huang, F. et al.,"k-t GRAPPA: A k-space Implementation for Dynamic MRI with High Reduction Factor," Magnetic Resonance in Medicine 54(5):1172-1184(2005).

* cited by examiner

RECONSTRUCTING MAGNETIC RESONANCE IMAGES FOR CONTRASTS

CROSS REFERENCE TO RELATED APPLICATIONS

This application claims priority to Chinese Patent Application No. 201710668012.5, filed on Aug. 7, 2017, the entire content of which is incorporated herein by reference.

BACKGROUND

The magnetic resonance imaging (MRI) equipment may obtain a plurality of images for different contrasts, thereby providing more information for examination.

In practical applications, such as relaxation parameter imaging, fat quantitative imaging, and so on, an imaging sequence in the MRI equipment may be used to scan a part of a subject multiple times based on different scanning parameters, so as to obtain a plurality of images for different contrasts. The images for different contrasts may include approximately same tissue structure information.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices and apparatus for reconstructing magnetic resonance images for contrasts.

In general, one innovative aspect of the subject matter described in this specification can be embodied in methods that include the actions of reconstructing magnetic resonance images for contrasts, including: collecting respective magnetic resonance signal data for each of T number of contrasts by scanning a subject with L number of channels in an undersampling manner so as to obtain L*T sets of k-space data $S_l^t$, where, $t \in \{1, 2, 3, \ldots, T\}$, $l \in \{1, 2, 3, \ldots, L\}$, T is an integer greater than or equal to 2 and L is an integer greater than or equal to 2; collecting respective central k-space magnetic resonance signal data for each of the T number of contrasts by scanning the subject with the L number of channels in a k-space central region of k-space in a fullsampling (or full sampling) manner so as to obtain L*T sets of central k-space data $S'_l^t$; for each of the L number of channels for each of the T number of contrasts, training a convolution kernel of respective phase encoding lines in the channel based on the L*T sets of central k-space data of the contrasts; determining uncollected k-space data in the channel by combining the convolution kernel of the respective phase encoding lines in the channel with the obtained k-space data in the L number of channels that is collected in the undersampling manner or the fullsampling manner or both, so as to obtain entire k-space data in the channel; and obtaining a respective magnetic resonance image for each of the T number of contrasts by performing image reconstruction based on the entire k-space data in each of the L number of channels for the contrast. Note that the terms "fullsampling" and "full sampling" can be interchangeably used in the present disclosure.

Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. For example, scanning the subject in the undersampling manner can include scanning k-space peripheral region of the subject, and the k-space peripheral region can refer to a region other than the k-space central region in the k-space.

In some cases, the actions include: simultaneously performing the scanning of the subject in the undersampling manner and the scanning of the subject in the k-space central region of k-space in the fullsampling manner. In some cases, the actions include separately performing the scanning of the subject in the undersampling manner and the scanning of the subject in the k-space central region of k-space in the fullsampling manner.

In some examples, the undersampling manner includes an equidistant undersampling manner. The equidistant undersampling manner can include one of the following: for at least two of the T number of contrasts, phase encoding lines collected in one of the L number of channels corresponding to k-space positions which are not exactly same; and for each of the T number of contrasts, phase encoding lines collected in one of the L number of channels corresponding to k-space positions which are same.

In some examples, the undersampling manner includes a non-equidistant undersampling manner. Training the convolution kernel of the respective phase encoding lines in the channel with the L*T sets of central k-space data can include: respectively training the convolution kernel of the respective phase encoding lines in the channel with the L*T sets of central k-space data via iterative convolution.

In some implementations, training the convolution kernel of the respective phase encoding lines in the channel for the contrast includes determining unknown parameters in a formula of the convolution kernel based on the L*T sets of central k-space data of the contrasts, where the central k-space data for each of the other contrasts is associated with the contrast by a respective weight, and determining uncollected k-space data in the channel includes using the formula and the obtained k-space data in the L number of channels.

In some implementations, training the convolution kernel of the respective phase encoding lines in the channel with the L*T sets of central k-space data of the contrasts includes: obtaining a plurality of equations based on the L*T sets of central k-space data $S'^t_l$ of the contrasts and a formula; and determining parameters $n_{b_1}(j, t, l, m)$ and $n_{b_2}^v(j, t, l, m)$ based on the plurality of equations. The formula can be expressed as:

$$S^t_j(k_y - m\Delta k_y) = \sum_{l=1}^{L} \left( \sum_{b_1=0}^{N_{b_1}} n_{b_1}(j, t, l, m) S^t_l(k_y - b_1 A \Delta k_y) + \sum_{v=t-m, t+A=m} \sum_{b_2=0}^{N_{b_2}-1} n^v_{b_2}(j, t, l, m) S^v_l(k_y - m\Delta k_y - b_2 A \Delta k_y) \right)$$

k represents a phase encoding line;

Δk represents a distance between two adjacent phase encoding lines;

A represents an acceleration factor, and $m \in \{1, 2, \ldots, A\}$;

$S_j^t(k_y - m \cdot \Delta k_y)$ represents data of a $(k_y - m \cdot \Delta k_y)$-th phase encoding line in a j-th channel for contrast t;

$S_l^t(k_y - b_1 A \Delta k_y)$ represents data of a $(k_y - b_1 A \Delta k_y)$-th phase encoding line in an l-th channel for contrast t;

$S'^v_l(k_y - m\Delta k_y - b_2 A\Delta k_y)$ represents data of a $(k_y \Delta m \Delta k_y - A \Delta k_y)$-th phase encoding line in the l-th channel for contrast v;

L represents a number of channels and is an integer greater than or equal to 2;

$N_{b_1}$ represents a number of blocks in a convolution kernel at the contrast t, wherein a block is defined as a combination of a single collected phase coding line and (A−1) missing phase coding lines within contrast t;

$N_{b_2}$ represents a number of blocks in a convolution kernel at the contrast v, wherein a block is defined as a combination of a single collected phase coding line and (A−1) missing phase coding lines within contrast v;

$n_{b_1}(j, t, l, m)$ represents a weight corresponding to the data of the $(k_y - b_1 A \Delta k_y)$-th phase encoding line in the l-th channel for block $b_1$ in the convolution kernel at contrast t;

$n_{b_2}^v(j, t, l, m)$ represents a weight of the data corresponding to the $(k_y - m\Delta k_y - b_2 A\Delta k_y)$-th phase encoding line in the l-th channel for block $b_2$ in the convolution kernel at contrast v;

l represents a channel index;

j represents a channel index;

$b_1$ represents an index of each block in the convolution kernel at contrast t;

$b_2$ represents an index of each block in the convolution kernel at contrast v; and v represents a contrast index.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Figure 1:
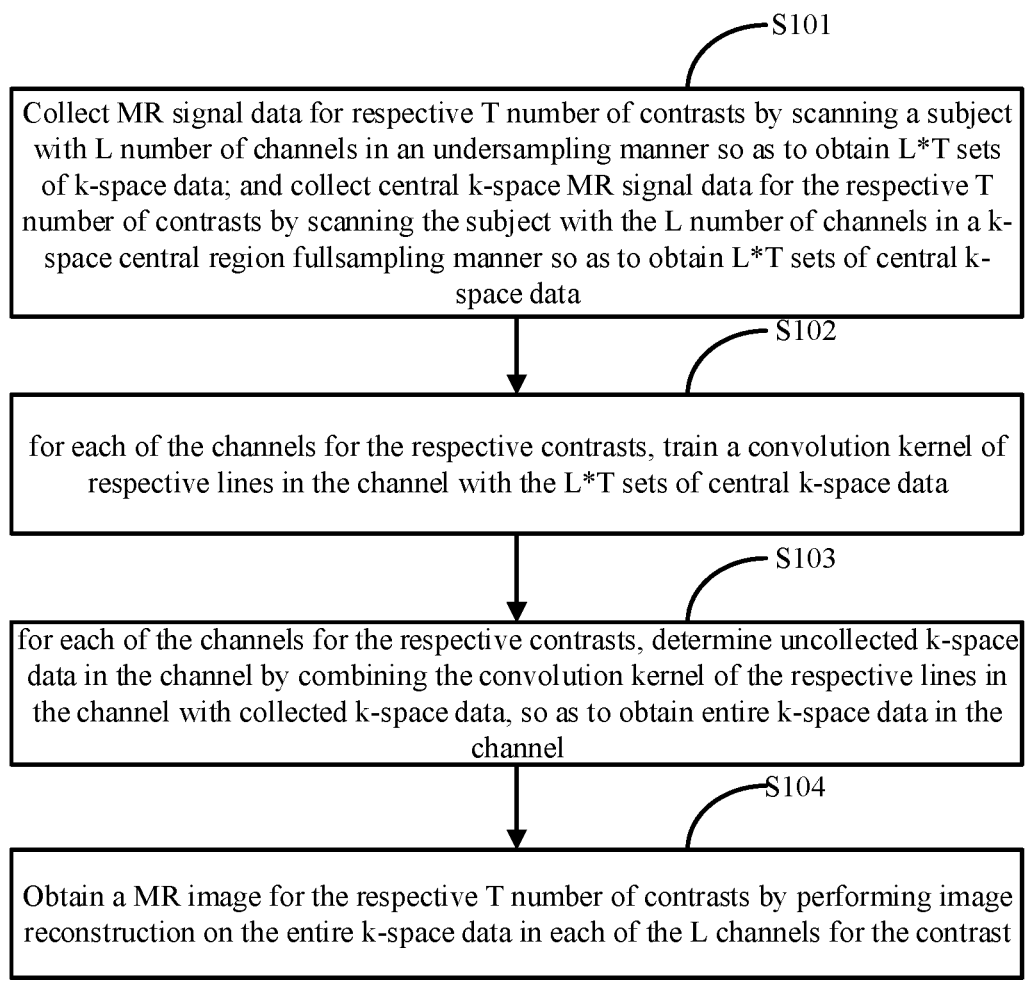
FIG. 1 is a flowchart of a process of a method of reconstructing magnetic resonance images for contrasts according to one or more examples of the present disclosure.

In MRI technology, to better perform clinical diagnosis, the subject is scanned multiple times with different contrasts. If the subject is scanned with only one contrast, the lesion area may not be accurately shown in the image. To relatively accurately obtain the lesion area, different contrasts may be used to scan the subject. Therefore, multi-contrast imaging is relatively common in MRI practical applications.

In an example, the subject is respectively scanned with different contrasts, so as to obtain an image for the respective contrasts. It can be seen that in this example, the imaging speed of the MRI equipment is relatively slow.

To shorten scanning time, in an example, a method of sharing data is used. For example, since the tissue structure information is represented by high frequency information in a k-space, the high frequency information in the k-space is shared. In this way, low frequency information for the respective contrasts is collected separately, thereby avoiding a case that high frequency information is repeatedly obtained and shortening the scanning time.

In the method of sharing data, since the tissue structure information for one contrast is directly shared to images for other contrasts, the contrasts between the images may be polluted, thereby affecting the image quality.

The present disclosure provides methods and devices for reconstructing magnetic resonance images for contrasts based on the GeneRalized Autocalibrating Partially Parallel Acquisitions (GRAPPA) principle.

To clearly understand examples of the present application, the principle of GRAPPA is first introduced.

The Parallel Imaging method uses multiple receiving coils of known position and sensitivity to assist in locating the spatial position of the MR (magnetic resonance) signal. Based on the position and sensitivity of the receiving coil, the number of phase encoding steps can be reduced, thereby shortening the scanning time.

A process of an MRI method based on the GRAPPA includes the following steps.

First, an undersampling (may also be referred to as subsampling) manner is applied in an entire k-space and a fullsampling manner is applied in a central region of the k-space. In the undersampling manner, some phase encoding lines (hereinafter, may also be referred to as lines) are missing in the k-space. That is, the missing lines are not scanned and thus there is no data collected for the missing lines. In the fullsampling manner, the central region of the k-space may be referred to as an Auto Calibrate Signal (ACS) region, which is a region near the centre of the k-space.

The k-space refers to a magnetic resonance signal space (a raw data space) that reflects characteristics of magnetic resonance signals in a frequency domain. Raw signal data obtained by magnetic resonance scanning is stored in the k-space, and a magnetic resonance image may be obtained by transforming (e.g., by Fourier transform) the data in the k-space. A principle of MRI spatial encoding specifies that each row of the k-space has a dedicated phase encoding. If the rows near the central region of the k-space are determined, the corresponding phase encoding lines can be determined. Then corresponding magnetic resonance scanning parameters can be set to achieve collection of magnetic resonance data corresponding to a central region of the k-space.

Second, uncollected data of the missing lines in the entire k-space is determined by fitting. In an example, a convolution kernel (including multiple blocks) of each of the receiving coils (or for each channel) is determined with the known data obtained by performing the fullsampling manner on the central region of the k-space. The convolution kernel reflects how the corresponding receiving coil distorts, smears, and displaces spatial frequencies within the full field of view (FOV) k-space data. The uncollected data of the missing lines in the entire k-space is determined by combining the convolution kernel with known data in each block obtained by performing the undersampling manner in the entire k-space or the fullsampling manner in the central k-space region or both. It is noted that one receiving coil corresponds to one k-space.

Third, the fitted uncollected data of the missing lines in the entire k-space is filled to obtain an entire k-space data for the receiving coil, and a Fourier transform is performed on the entire k-space data for the receiving coil to obtain an image for the receiving coil.

Fourth, the images for the respective receiving coils are at last combined using a square root of a sum of squares method into a final magnitude image.

The following is an example of the principle of GRAPPA by taking four channels (that is, four receiving coils) and an acceleration factor determined by the undersampling manner being 2. For example, an acceleration multiple of the undersampling manner may be called as an acceleration factor of the scan. It is assumed that for the k-space of the respective channels, data of the odd-numbered lines is collected by performing the undersampling manner in the entire k-space, that is, MR signal data of the 1st, 3rd, 5th, . . . , (2k+1)-th lines is collected, where k is an integer greater than or equal to 0.

Before image reconstruction, data of the uncollected even-numbered lines is filled, that is, the data of the 2-nd, 4-th, 6-th, . . . , (2k+2)-th lines is filled. The data of the uncollected even-numbered lines can be obtained by linear fitting. An uncollected line refers to a line which is not scanned.

In an example, the linear fitting is performed by the following formula (1):

$$Y_i^n = w_1 Y_{-1}^1 + w_2 Y_{i+1}^1 + w_3 Y_{i-1}^2 + w_4 Y_{i+1}^2 + w_5 Y_{i-1}^3 + w_6 Y_{i+1}^3 + w_7 Y_{1-1}^4 + w_8 Y_{i+1}^4 \quad (1)$$

Where, $Y_i^n$ represents data of an i-th line of an n-th channel, i∈{2, 4, 6, 8, . . . , 2k}, n∈{1, 2, 3, 4}, $W_1$ represents a weight of the (i−1)-th line of the channel 1 when the convolution kernel of the i-th line of the n-th channel is calculated, and a set from $W_1$ to $W_8$ represents the GRAPPA convolution kernel of the i-th line of the n-th channel. $W_1$ to $W_8$ can be obtained by training the data of the ACS region.

It is noted that, based on the principle of the GRAPPA, for the above formula (1), the convolution kernel from $W_1$ to $W_8$ can be applied to all lines of the n-th channel, but for other channels, the convolution kernel from $W_1$ to $W_8$ cannot be used and a new convolution kernel is needed.

In the above example, since the data of the first line and the third line which are adjacent to the second line are both collected, the data of the third line and the fifth line which are adjacent to the fourth line are both collected, . . . , the data of the (2k−1)-th line and the (2k+1)-th line which are adjacent to the 2k-th line are both collected, the 2-nd line, the 4-th line, . . . , the 2k-th line has a same relative k-space positional relationship with its adjacent collected line (the collected line refers to a line having k-space data). Therefore, the 2-nd line, the 4-th line, . . . , the 2k-th line can share a convolution kernel. That is, when the convolution kernel of the 2-nd line is obtained based on the formula (1), other even-numbered lines may directly use the convolution kernel of the 2-nd line, without training. The data of the respective even-numbered lines is obtained by combining the convolution kernel of the 2-nd line with the data of the two lines adjacent to the even-numbered line.

A line at a same k-space position for different channels corresponds to a different convolution kernel. In the above example, 4*1 convolution kernels are trained. It is noted that the convolution kernel described in the above example refers to a set from $W_1$ to $W_8$.

If the above example is extended, it is assumed that the acceleration factor is A and the number of the channels is N, for each of the N channels, data of only the (A*k+i)-th lines is collected. Where, A is an integer greater than or equal to 2, k is an integer, 1≤i≤A and i is an integer.

The (A*k+j)-th line (1≤j≤A, j≠i and j is an integer) has a same relative k-space positional relationship with its adjacent collected line. Therefore, a convolution kernel is shared by the (A*k+j)-th lines in one channel. In one channel, (A−1) number of convolution kernels are trained. In this way, when the number of the channels is N and the acceleration factor for the respective channels is A, (A−1)*N number of convolution kernels are trained to obtain data of the uncollected lines.

In an example, it is assumed that the acceleration factor for accelerating the data collecting speed is 4, the number of the channels is 8 and in the respective channels, the (4k+1)-th lines are collected. In the respective channels, the collected lines are respectively the 1-st line, the 5-th line, the 9-th line, the 13-th line, . . . , and the (4k+1)-th line. In this case, for one channel, the 2-nd, the 6-th, the 10-th, . . . , and the (4k+2)-th line may use a same convolution kernel; the 3-rd, the 7-th, the 11-th, . . . , and the (4k+3)-th line may use a same convolution kernel; the 4-nd, the 8-th, the 12-th, . . . , and the (4k+4)-th line may use a same convolution kernel. In this case, 24 number of convolution kernels are trained to obtain data of the uncollected lines.

The training process of the GRAPPA convolution kernel is described below. When introducing the training process, the data collection method in which the acceleration factor is 2 and the number of the channels is 4 is taken as an example.

A pixel matrix of 256*256 is taken as an example. For the respective channels, data $Y_j^n$ from the 96-th line to 127-th line is collected. Where, n represents a channel index, such as the n-th channel, n∈{1, 2, 3, 4}, j represents a line number, such as the j-th line, and j∈{96, 97, . . . , 127}. $Y_h^n$ represents collected data of the j-th line in the n-th channel. When the convolution kernel of the second line in the first channel is trained, the collected data of the 97-th line in the first channel is brought to the left of the formula (1), and the collected data of the 96-th line in the respective channels and the collected data of the 98-th line in the respective channels are respectively brought into the right of the formula (1), so that an equation is obtained; the collected data of the 98-th line in the first channel is brought to the left of the formula (1), and the collected data of the 97-th line in the respective channels and the collected data of the 99-th line in the respective channels are respectively brought into the right of the formula (1), so that an equation is obtained; . . . ; the collected data of the (j+1)-th line in the first channel is brought to the left of the formula (1), and the collected data of the j-th line in the respective channels and the collected data of the (j+2)-th line in the respective channels are respectively brought into the right of the formula (1). Therefore, since the central region of the k-space in the respective channels includes 32 lines, if the data of all the 32 lines is brought to the equation (1), a set of equations including 30×256 number of equations can be obtained. In each equation, the convolution kernel from $W_1$ to $W_8$ is unknown and other parameters of the equation are known, therefore, the convolution kernel from $W_1$ to $W_8$ of the second line in the first channel is determined based on the set of equations. Where, $W_1$ and $W_2$ represent two weights of the convolution kernel in the first channel; $W_3$ and $W_4$ represent two weights of the convolution kernel in the second channel; $W_5$ and $W_6$ represent two weights of the convolution kernel in the third channel; and $W_7$ and $W_8$ represent two weights of the convolution kernel in the fourth channel.

When the GRAPPA convolution kernel from $W_1$ to $W_8$ of the second line in the first channel is determined, linear fitting is performed by using the convolution kernel from $W_1$ to $W_8$ and two adjacent odd-numbered lines in the respective channels, so as to obtain data of the uncollected even-numbered line. In an example, data of the second line in the first channel is obtained based on the data of the first line and the third line in the respective channels and the formula (1); data of the fourth line in the first channel is obtained based on the data of the third line and the fifth line in the respective channels and the formula (1); . . . , and so on. In this way, the data of all the even-numbered lines in the first channel is obtained. Therefore, the entire k-space data of the respective channels can be obtained by filling the fitted data to the corresponding uncollected lines.

Then, an image of the respective channels can be obtained by performing image reconstruction on the entire k-space data of the channel. An MR image can be obtained by combining the image of the respective channels.

As can be seen from the above, during the convolution kernel training process, the data $Y_i^n$ of the ACS region (the central region of the k-space) is known, and the convolution kernel $W_i$ is obtained based on these known data. During the data fitting process, the convolution kernel $W_i$ is known, and the data located to the right of the formula (1) is also known by performing the undersampling manner in the entire k-space or the fullsampling manner in the central k-space region or both, so that the data of the uncollected line can be calculated according to the formula (1).

The above is the principle of GRAPPA.

In an example, in a method of reconstructing magnetic resonance images for contrasts, GRAPPA may be referenced, for example, the MR signal data of the respective channels for different contrasts is used.

Therefore, based on the principle of GRAPPA, a method of reconstructing magnetic resonance images for contrasts is provided in the present disclosure. That is, the method of reconstructing magnetic resonance images for contrasts provided by the present disclosure is based on the principle of GRAPPA. In an example, MR signal data for the respective contrasts is collected via scanning in the undersampling manner. And, k-space central region MR signal data (hereinafter, may also be referred to as central k-space MR signal data) for the respective contrasts is collected via scanning in the fullsampling manner. The central k-space MR signal data is collected at a region near the center of k-space. The central k-space MR signal data is used to train a convolution kernel of respective lines. The convolution kernel of respective lines is used to determine uncollected MR signal data.

When uncollected MR signal data for one contrast is to be determined with a convolution kernel, by each convolution kernel, MR signal data with relatively higher correlation among other contrasts is associated according to different weights. In other words, the correlation between different contrasts is represented by each convolution kernel. The uncollected MR signal data for the contrast is obtained based on the corresponding convolution kernel and the associated MR signal data for other contrasts. Then, an image for the contrast can be reconstructed by using the collected data for the contrast and the obtained uncollected data for the contrast. In the method, the association between the images for the respective contrasts is used, thereby providing more information for obtaining the uncollected data. In this way, the accuracy of the uncollected data can be improved and further the quality of the images for the respective contrasts can be improved.

The method of reconstructing magnetic resonance images for contrasts provided in the present disclosure are described in detail below with reference to the accompanying drawings.

FIG. 1 is a flowchart of a process of a method of reconstructing magnetic resonance images for contrasts according to one or more examples of the present disclosure. As shown in FIG. 1, the process of the method can include the following steps.

At step S101, according to preset magnetic resonance scanning parameters, MR signal data for each of T number of contrasts is respectively collected by scanning a subject with L number of channels in an undersampling manner so as to obtain L*T sets of k-space data $S_i^t$; central k-space MR signal data for the T number of contrasts is respectively collected by scanning the subject with the L number of channels in a k-space central region fullsampling manner so as to obtain L*T sets of central k-space data $S'_i^t$; where, $l \in \{1, 2, 3, \ldots, T\}, l \in \{1, 2, 3, \ldots, L\}$, T is an integer greater than or equal to 2 and L is an integer greater than or equal to 2. Each contrast corresponds to respective preset magnetic resonance scanning parameters. The respective preset magnetic resonance scanning parameters for the contrasts can be set such that contrast information of the contrasts belongs to low frequency information and the tissue structure information is substantially the same. In some cases, compared with an MR image obtained with one contrast, an MR image obtained with different contrasts has a better quality and can reflect some lesions more accurately.

The k-space central region fullsampling manner refers to that MR signal data of all lines in the k-space central region is collected. The k-space central region refers to a region near the center of k-space. In an example, it is assumed that when the k-space central region includes 32 lines, in the k-space central region fullsampling manner, the MR signal data of the 32 lines is collected. The undersampling manner refers to that MR signal data of partial lines in k-space is collected. For example, MR signal data of the odd-numbered lines in the k-space is collected.

It is noted that the MR signal data in the k-space central region can reflect contrast information, which belongs to low-frequency MR signal data in the k-space.

In addition, it is noted that the MR signal data in the k-space peripheral region can reflect tissue structure information, which belongs to high-frequency MR signal data in the k-space. The k-space peripheral region refers to a region other than the k-space central region in the k-space.

At step S102, for each of the channels for each of the contrasts, a convolution kernel of respective lines in the channel is respectively trained with the L*T sets of central k-space data $S'_l{}^t$.

It is assumed that the acceleration factor is A, for each of the channels for each of the contrasts, a line number of the respective collected lines is expressed by (A*k+i). Where, A is an integer greater than or equal to 2, k is an integer, $1 \leq i \leq A$, and i is an integer.

In one channel for one contrast, if line numbers of uncollected lines are respectively expressed by (A*k+j) (where, k is an integer, $1 \leq j \leq A$, $j \neq i$, and j is an integer), the uncollected lines shares one convolution kernel. It is noted that if j is different, the corresponding convolution kernel is different.

For one contrast, the convolution kernel corresponding to MR signal data of different channels is different. For different contrasts, the convolution kernel corresponding to MR signal data of a same channel is different.

Based on the above description, for T contrasts, L channels, acceleration factor being A, at least T*L*(A−1) convolution kernels are to be trained.

At step S103, for each of the channels for each of the contrasts, uncollected k-space data in the channel is determined by combining the convolution kernel of the respective lines in the channel with collected k-space data, so as to obtain entire k-space data in the channel.

At step S104, an MR image for each of the T number of contrasts is respectively obtained by performing image reconstruction on the entire k-space data in each of the L channels for the contrast.

In an example, an MR image for the contrast 1 is obtained by performing image reconstruction on the entire k-space data in each of the L channels for the contrast 1; an MR image for the contrast 2 is obtained by performing image reconstruction on the entire k-space data in each of the L channels for the contrast 2; . . . ; and an MR image for the contrast T is obtained by performing image reconstruction on the entire k-space data in each of the L channels for the contrast T. In this way, MR images for the T number of contrasts are reconstructed.

It is noted, in an example, for one contrast, the Fourier transform is performed on the entire k-space data in each of the L channels. In this way, for one contrast, L number original images are obtained. Then, the L number original images are combined by using a square root of a sum of squares of the L number original images into the MR image for the contrast. Therefore, T number of MR images can be obtained for the T number contrasts.

In the method of reconstructing MR images for contrasts, respective k-space data $S_l{}^t$ for each of the contrasts is collected via scanning in the undersampling manner. And respective central k-space MR signal data for each of the contrasts is collected via scanning in the k-space central region fullsampling manner. The central k-space MR signal data is collected at a region near the center of k-space. The central k-space MR signal data is used to train a convolution kernel of respective lines. The convolution kernel of respective lines is used to determine uncollected MR signal data.

When training a convolution kernel for one contrast, MR signal data with relatively higher correlation among other contrasts is used in a way that the contrasts are associated. The uncollected MR signal data is determined with the convolution kernel which is obtained by associating MR signal data with relatively higher correlation among other contrasts. An entire k-space data is obtained by filling the uncollected MR signal data into the k-space. In this way, the entire k-space data can be used to reconstruct an image. In the method, the association/correlation between the images for the respective contrasts is used, thereby providing more information for obtaining the uncollected data. In this way, the accuracy of the uncollected data can be improved and further the quality of the images for the respective contrasts can be improved.

Detailed description of step S101 is described below.

In an example, step S101 is performed with an embedded sampling manner. The embedded sampling manner refers to that the undersampling manner and the k-space central region fullsampling manner are simultaneously performed. In this case, the fullsampling for the k-space central region and the undersampling for the k-space peripheral region are completed at a same sampling process.

In another example, step S101 is performed with an additional sampling manner. The additional sampling manner refers to that the undersampling manner and the k-space central region fullsampling manner are separately performed. In this case, the fullsampling for the k-space central region and the undersampling for the k-space peripheral region are separately performed.

In an example, when step S101 is performed with the embedded sampling manner, it includes: according to preset magnetic resonance scanning parameters, respectively collecting k-space-peripheral-region-MR-signal data for each of T number of contrasts by scanning the subject with L number of channels in the undersampling manner so as to obtain L*T sets of k-space data $S_l{}^t$; and at the same time, respectively collecting central k-space MR signal data for each of the T number of contrasts by scanning the subject with the L number of channels in the k-space central region fullsampling manner so as to obtain L*T sets of central k-space data $S'_l{}^t$.

It is noted that, for one contrast, since in the different sampling manners, partial MR scanning parameters associated with the sampling manner are different, except for the partial MR scanning parameters, other MR scanning parameters applied in the undersampling manner and the k-space central region fullsampling manner are the same. In an example, the MR scanning parameters include repetition time, number of slices to be scanned, echo time, slice thickness, inversion time, slice spacing, sampling bandwidth, flip angle, number of excitations, echo train length and so on. For one contrast, during the undersampling and the fullsampling, MR scanning parameters including repetition time, number of slices to be scanned, echo time, slice thickness, inversion time, slice spacing, sampling bandwidth and flip angle are the same, and at the same time, MR scanning parameters including a number of excitations and echo train length are different.

In the embedded sampling manner, the fullsampling for the k-space central region and the undersampling for the k-space peripheral region are performed at a same sampling process. It can be seen that, with the embedded sampling manner, MR signal data is collected only once for one contrast. The k-space region may be divided into the central region and the peripheral region. During one sampling process, MR signal data for the k-space peripheral region is collected with the undersampling manner to speed up the scanning speed; and MR signal data for the k-space central region is collected with the k-space central region fullsampling manner. MR signal data for the k-space central region is used to train a convolution kernel.

Figure 2:
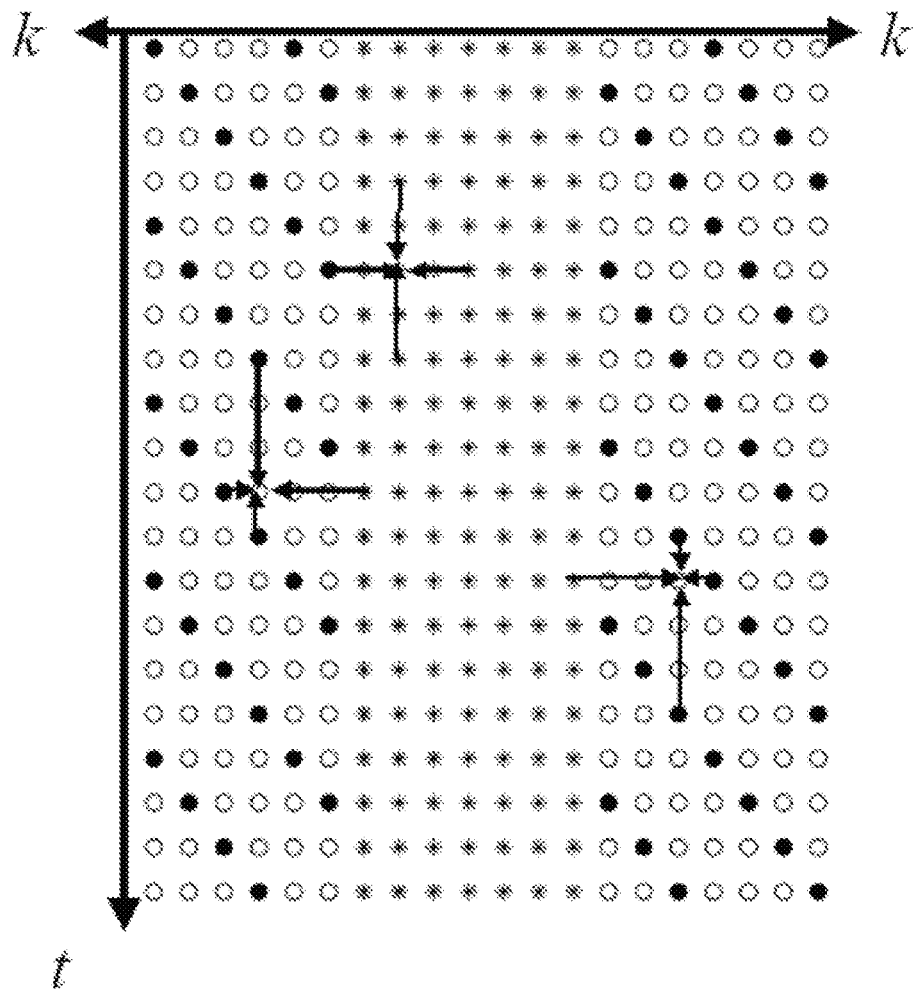
FIG. 2 is a schematic diagram of an embedded sampling manner for collecting MR signal data in k-space according to one or more examples of the present disclosure.

FIG. 2 illustrates a schematic diagram of the embedded sampling manner for collecting MR signal data in k-space according to one or more examples of the present disclosure.

As shown in FIG. 2, k represents a phase coding direction, and t represents a contrast direction. An asterisk represents a collected point (refers to a point at which MR signal data is collected) on the k-space central region. A solid black dot represents a collected point on the k-space peripheral region. A hollow point represents an uncollected point (refers to a point at which MR signal data is not collected) on the k-space peripheral region. It is noted that, when setting different scanning parameters, the contrast t is different. For example, when TE (echo time) is different, the contrast t is different; or when flip angle is different and the TE is the same, the contrast t is different. The setting of scanning parameters depends on an application scenario. From FIG. 2, the embedded sampling manner is characterized in that the k-space central region fullsampling manner is performed for the k-space central region and the undersampling manner is performed for the k-space peripheral region.

It is noted that MR signal data of the k-space central region is low-frequency, which can reflect image contrast information.

Figure 3:
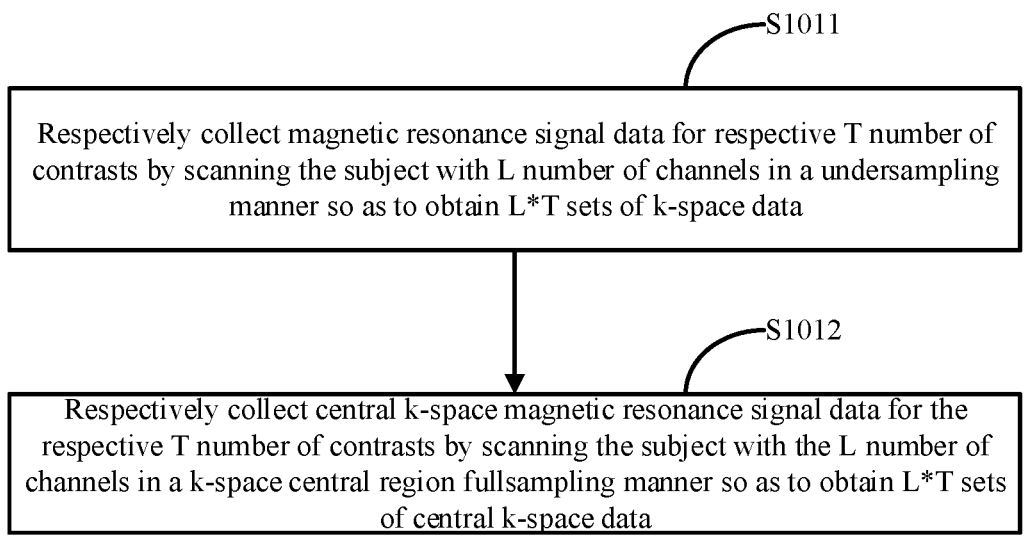
FIG. 3 is a flowchart of step S101 according to an example of the present disclosure.

In an example, when step S101 is performed with the additional sampling manner, it includes steps S1011-S1012. FIG. 3 is a schematic flowchart of step S101 according to an example of the present disclosure.

At step 1011, according to preset magnetic resonance scanning parameters, magnetic resonance signal data for each of T number of contrasts is respectively collected by scanning the subject with L number of channels in an undersampling manner so as to obtain L*T sets of k-space data $S_l^t$.

At step 1011, magnetic resonance signal data for each contrast in an entire k-space is collected via scanning in the undersampling manner.

For one channel, one set of k-space data is obtained. When the number of the channels is L and the number of contrasts is T, L*T sets of k-space data $S_l^t$ are obtained.

At step 1012, according to preset magnetic resonance scanning parameters, central k-space magnetic resonance signal data for each of the T number of contrasts is respectively collected by scanning the subject with the L number of channels in a k-space central region full sampling manner so as to obtain L*T sets of central k-space data $S'^t_l$.

At step 1012, for each contrast, magnetic resonance signal data in the k-space central region is collected by the k-space central region fullsampling manner.

It is noted that the present application does not limit the sequence of the steps S1011 and S1012. That is, the step S1011 may be performed first, and then step S1012, or step S1012 may be performed first, and then step S1011.

Figure 4:
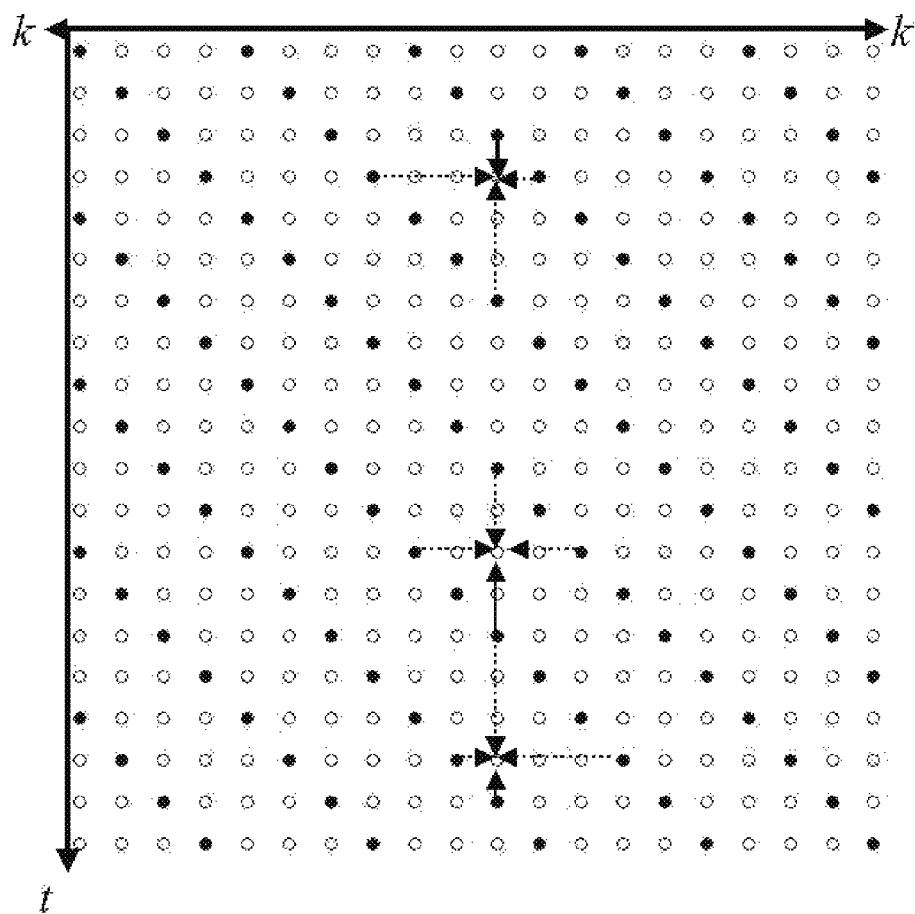
FIG. 4 is a schematic diagram of an additional sampling manner for collecting MR signal data in k-space according to one or more examples of the present disclosure.

In the additional sampling manner, for one contrast, MR signal data is collected twice. FIG. 4 illustrates a schematic diagram of the additional sampling manner for MR signal data in k-space according to one or more examples of the present disclosure. As shown in FIG. 4, k represents the phase coding direction, and t represents the contrast direction. A solid black dot represents a collected point (refers to a point at which MR signal data is collected). A hollow point represents an uncollected point (refers to a point at which MR signal data is not collected). From FIG. 4, the additional sampling manner is characterized in that the undersampling manner is performed on the entire the k-space when MR signal data is collected each time.

In an example, the undersampling manner includes an equidistant undersampling manner. In the equidistant undersampling manner, for one channel for one contrast, the distance between each adjacent two collected lines is equal. When MR signal data is collected with the equidistant undersampling manner, the subsequent training convolution kernel process can be made relatively easy.

In an example, magnetic resonance signal data for the T number of contrasts is respectively collected with L number of channels in the equidistant undersampling manner so as to obtain L*T sets of k-space data $S_l^t$.

In an example, the equidistant undersampling manner includes a GRAPPA accelerated interleaved partial acquisition manner.

In the GRAPPA accelerated interleaved partial acquisition manner, for at least two of the T number of contrasts, lines collected in one of the L number of channels correspond to k-space positions which are not exactly same.

In an example, it is assumed that the acceleration factor is A, for one channel for each contrast, k-space positions (such as, line numbers) of collected lines corresponding to the channel are expressed as (A*k+i), where, 1≤i≤A and i is an integer, and for at least two contrasts, values of i in (A*k+i) are different. In this way, the collected lines for one channel for multiple contrasts can cover the entire k-space corresponding to the channel, and thus data of an uncollected line which is determined by a corresponding convolution kernel can be relatively more accurate.

The GRAPPA accelerated interleaved partial acquisition manner is described by taking the acceleration factor being A and the number of contrasts being 8 as an example. For one channel for different contrasts, the collected lines includes the following:

for contrast 1, k-space positions of collected lines is (4k+1)-th;

for contrast 2, k-space positions of collected lines is (4k+2)-th;

for contrast 3, k-space positions of collected lines is (4k+3)-th;

for contrast 4, k-space positions of collected lines is (4k+4)-th;

for contrast 5, k-space positions of collected lines is (4k+1)-th;

for contrast 6, k-space positions of collected lines is (4k+2)-th;

for contrast 7, k-space positions of collected lines is (4k+3)-th; and for contrast 8, k-space positions of collected lines is (4k+4)-th.

By the GRAPPA accelerated interleaved partial acquisition manner, the collected lines for one channel for multiple contrasts can cover the entire k-space corresponding to the channel, and thus data of an uncollected line which is determined by a corresponding convolution kernel can be relatively more accurate.

In another example, the equidistant undersampling manner includes a SENSE (SENSitivity Encoding) equidistant partial sampling manner.

In the SENSE equidistant partial sampling manner, for one channel for the respective contrasts, for each of the respective T number of contrasts, phase encoding lines collected in one of the L number of channels correspond to k-space positions which are same.

In an example, it is assumed that the acceleration factor is A, for one channel for each contrast, k-space positions of collected lines are expressed as (A*k+i), where, 1≤i≤A and i is an integer, and for each contrast, a value of i in (A*k+i) is same.

A case that for one channel for the respective contrasts, k-space positions of collected phase encoding lines corresponding to the channel are same is described by taking the acceleration factor being A and the number of contrasts being 8 as an example. For one channel for different contrasts, the collected lines includes the following:

for contrast 1, k-space positions of collected lines is (4k+1)-th;
for contrast 2, k-space positions of collected lines is (4k+1)-th;
for contrast 3, k-space positions of collected lines is (4k+1)-th;
for contrast 4, k-space positions of collected lines is (4k+1)-th;
for contrast 5, k-space positions of collected lines is (4k+1)-th;
for contrast 6, k-space positions of collected lines is (4k+1)-th;
for contrast 7, k-space positions of collected lines is (4k+1)-th; and
for contrast 8, k-space positions of collected lines is (4k+1)-th.

The above is examples of step S101.

The following describes step S102 in detail.

In an example, when magnetic resonance signal data for each of T number of contrasts is respectively collected with L number of channels in an equidistant undersampling manner so as to obtain L*T sets of k-space data $S_j^t$. When the acceleration factor is A, the line numbers of the collected lines of the first channel for contrast t are expressed as (A*k+m), where, k is an integer greater than or equal to 0, and m∈{1, 2, . . . , A}.

The step S102 includes: training the convolution kernel of the respective lines in each channel for each contrast by the following formula (2):

$$S_j^t(k_y - m\Delta k_y) = \sum_{l=1}^{L}\left(\sum_{b_1=0}^{N_{b_1}} n_{b_1}(j, t, l, m) S_l^t(k_y - b_1 A\Delta k_y) + \sum_{v=t-m, t+A=m} \sum_{b_2=0}^{N_{b_2}-1} n_{b_2}^v(j, t, l, m) S_l^v(k_y - m\Delta k_y - b_2 A\Delta k_y)\right) \quad (2)$$

In the formula (2), $k_y$ represents a line number of a line;

$\Delta k_y$ represents a distance between two adjacent lines, and $\Delta k_y = 1$;

A represents an acceleration factor, and m∈{1, 2, . . . , A};

$S_j^t(k_y - m \cdot \Delta k)$ represents data of a $(k_y - m \cdot \Delta k)$-th line in a j-th channel for a contrast t;

$S_l^t(k_y - b_1 A\Delta k_y)$ represents data of a $(k_y - b_1 A\Delta k_y)$-th line in a l-th channel for the contrast t;

$S_l^v(k_y - m\Delta k_y - b_2 A\Delta k_y)$ represents data of a $(k_y - m\Delta k_y - b_2 A\Delta k_y)$-th line in the l-th channel for a contrast v;

L represents a number of channels and is an integer greater than or equal to 2;

$N_{b_1}$ represents a number of blocks in a convolution kernel at the contrast t, wherein a block is defined as a combination of a single collected phase coding line and (A−1) missing phase coding lines within the contrast t;

$N_{b_2}$ represents a number of blocks in a convolution kernel at the contrast v, wherein a block is defined as a combination of a single collected phase coding line and (A−1) missing phase coding lines within the contrast v;

$n_{b_1}(j, t, l, m)$ represents a weight corresponding to the data of the $(k_y - b_1 A\Delta k_y)$-th in the l-th channel for a block $b_1$ in the convolution kernel at the contrast t;

$n_{b_2}^v(j, t, l, m)$ represents a weight corresponding to the data of the $(k_y - m\Delta k_y - b_2 A\Delta k_y)$-th line in the l-th channel for a block $b_2$ in the convolution kernel at the contrast v;

l represents a channel index;
j represents a channel index;
$b_1$ represents an index of each block in the convolution kernel at the contrast t;
$b_2$ represents an index of each block in the convolution kernel at the contrast v; and
v represents a contrast index.

When values of j, t and m are not changed, the weight $n_{b_1}(j, t, l, m)$ corresponds to a set in a case that l is from 1 to L and $b_1$ is from 1 to $Nb_1$, the weight $n_{b_2}^v(j, t, l, m)$ corresponds to a set in a case that l is from 1 to L, $b_2$ is from 1 to $Nb_2$, and v is (t−m) or (t+A−m). For the formula (2), the convolution kernel of the $(k_y - m \cdot \Delta k_y)$-th line in the j-th channel for the contrast t is associated with the above two sets.

The following describes the training process in detail.

First, a plurality of equations including unknown parameters $n_{b_1}(j, t, l, m)$ and $n_{b_2}^v(j, t, l, m)$ are obtained based on the L*T sets of central k-k-space data $S'_j{}^t$, and the above formula (2). Then, the parameters $n_{b_1}(j, t, l, m)$ and $n_{v_2}^v(j, t, l, m)$ are determined based on the plurality of equations.

In an example, the collected central k-space data $S_j^t(k_y - m \cdot \Delta k_y)$, $S_l^t(k_y - b_1 A\Delta k_y)$ and $S'_l{}^v(k_y - m\Delta k_y - b_2 A\Delta k_y)$ are substituted into the formula (2) in a way that a plurality of equations are obtained. In the plurality of equations, unknown parameters $n_{b_1}(j, t, l, m)$ and $n_{b_2}^v(j, t, l, m)$ are to be determined. The number of lines in the k-space central region is set such that the number of the equations is greater than or equal to the number of the unknown parameters. In this way, the unknown parameters are determined. The convolution kernel of the $(k_y - m \cdot \Delta k_y)$-th line in the j-th channel for the contrast t includes $n_{b_1}(j, t, l, m)$ and $n_{b_2}^v(j, t, l, m)$.

Based on the above formula (2), the convolution kernel of the respective lines in each channel for different contrasts can be obtained.

When the convolution kernel of the respective lines in each channel for each of different contrasts is obtained, the uncollected data may be obtained by using the convolution kernel.

The detailed description of step S103 is described below.

At step S102, the convolution kernel of the respective lines in each channel for each of contrasts is obtained. Based on the formula (2), by substituting the collected data into the right of the formula (2), the uncollected k-space data can be calculated.

That is, at step S103, the items in the right of the formula (2) are known and the item in the left of the formula (2) is unknown. The uncollected k-space data can be calculated based on the known items in the right of the formula (2). The uncollected k-space data may also be referred to as fitted data.

For one channel for one contrast, the fitted data is filled into the k space corresponding to the channel, and thus entire k-space data is obtained.

It is noted that when the undersampling manner is the equidistant undersampling manner, the above process of training the convolution kernel is not iterative. That is, after the convolution kernel is determined, there is no need to repeat training the convolution kernel.

In an example, the undersampling manner includes a non-equidistant undersampling manner. When MR signal data is collected via scanning in the non-equidistant undersampling manner, the convolution kernel of the respective lines in each channel for each contrast is respectively trained with the L*T sets of central k-space data $S'^t_l$ via iterative convolution. That is, in this case, the process of training the convolution kernel is an iterative process. The process of training the convolution kernel via iterative convolution is similar with the process of training the convolution kernel in which the equidistant undersampling manner is used. The difference is: when training the convolution kernel via iterative convolution, each convolution kernel needs to be trained repeatedly until an expectation is satisfied.

In addition, the process of training the convolution kernel may use any collected data, or data obtained by the previous iteration. For each channel for each contrast, shape and size of each convolution kernel may be different.

Based on the GRAPPA principle, the convolution kernel is trained with the central k-space data of the ACS region, which can reflect sensitive information of each channel. Since the sensitive information is low-frequency information, the k-space central region is taken as the ACS region. In MR images for different contrasts, the tissue structure information is substantially same and the difference is shown in contrast. For frequency domain, the tissue structure information belongs to high-frequency information, which is located at the k-space periphery region; and the contrast information belongs to low-frequency information, which is located at the k-space central region. Therefore, when training the convolution kernel, the contrast information between MR images is involved. In this way, the trained convolution kernel includes contrast correlation between the MR images for the respective contrasts. When uncollected data is fitted with the corresponding convolution kernel, the fitted uncollected data also includes the contrast correlation. It can be found that high-frequency information to reflect the tissue structure information also includes the contrast correlation, and thus the pollution between the contrasts can be reduced. Therefore, the MR image obtained by the method of reconstructing magnetic resonance images for contrasts provided by the present disclosure can have a relatively great imaging effect. Or, the parallel imaging speed can be further increased in the case of an acceptable imaging effect.

Based on the methods of reconstructing magnetic resonance images for contrasts provided by the present disclosure, the present disclosure further a device for reconstructing magnetic resonance images for contrasts.

Figure 5:
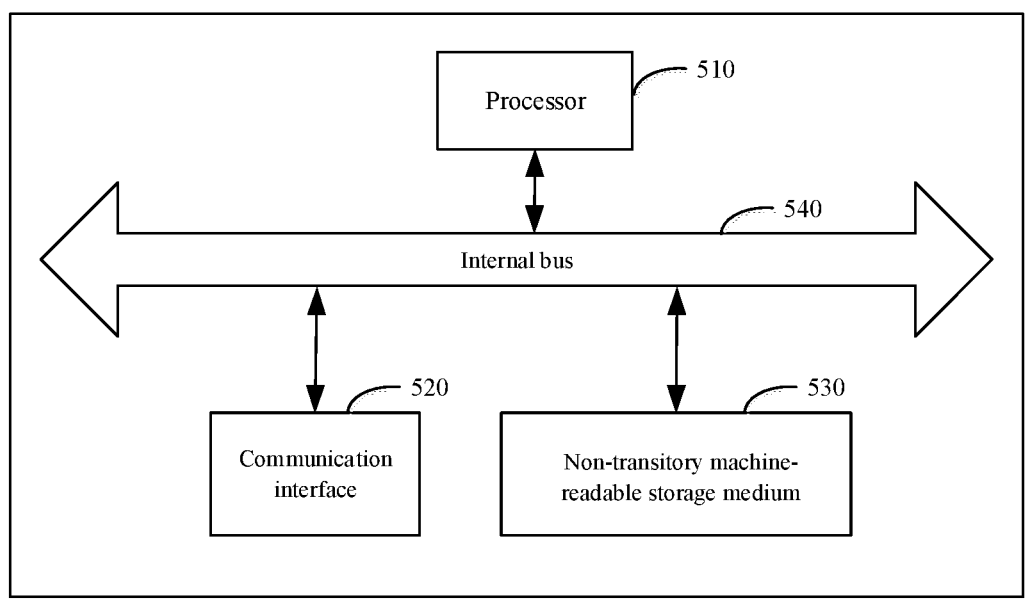
FIG. 5 is a schematic diagram of an example hardware structure of a device for reconstructing magnetic resonance images for contrasts.

FIG. 5 is a schematic diagram of an example hardware structure of a device for reconstructing magnetic resonance images for contrasts. The device includes a processor 510, a communication interface 520, a non-transitory machine readable storage medium 530 and an internal bus 540. The processor 510, the communication interface 520 and the non-transitory machine readable storage medium 530 are typically connected to each other by the internal bus 540.

The processor 510 may read the machine executable instructions stored in the non-transitory machine readable storage medium 530 to perform the method of reconstructing magnetic resonance images for contrasts described above.

It is noted that the device for reconstructing magnetic resonance images for contrasts corresponds to the method of reconstructing magnetic resonance images for contrasts. The device can reach a same technical effect as the method, and further detail is omitted for brevity.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of reconstructing magnetic resonance images for contrasts, comprising:

collecting respective magnetic resonance signal data for each of T number of contrasts by scanning a subject with L number of channels in an undersampling manner so as to obtain L*T sets of k-space data $S'^t_l$, wherein, $t \in \{1, 2, 3, \ldots, T\}$, $l \in \{1, 2, 3, \ldots, L\}$, T is an integer greater than or equal to 2 and L is an integer greater than or equal to 2;

collecting respective central k-space magnetic resonance signal data for each of the T number of contrasts by scanning the subject with the L number of channels in a k-space central region of k-space in a fullsampling manner so as to obtain L*T sets of central k-space data $S'^t_l$;

for each of the L number of channels for each of the T number of contrasts, training a convolution kernel of respective phase encoding lines in the channel based on the L*T sets of central k-space data of the contrasts;

determining uncollected k-space data in the channel by combining the convolution kernel of the respective phase encoding lines in the channel with the obtained k-space data in the L number of channels that is collected in the undersampling manner or the fullsampling manner or both, so as to obtain entire k-space data in the channel; and obtaining a respective magnetic resonance image for each of the T number of contrasts by performing image reconstruction based on the entire k-space data in each of the L number of channels for the contrast.

2. The method of claim 1, further comprising:

simultaneously performing the scanning of the subject in the undersampling manner and the scanning of the subject in the k-space central region of k-space in the fullsampling manner.

3. The method of claim 1, further comprising:
separately performing the scanning of the subject in the undersampling manner and the scanning of the subject in the k-space central region of k-space in the fullsampling manner.

4. The method of claim 1, wherein the undersampling manner comprises an equidistant undersampling manner.

5. The method of claim 4, wherein the equidistant undersampling manner comprises one of the following:
for at least two of the T number of contrasts, phase encoding lines collected in one of the L number of channels corresponding to k-space positions which are not exactly same; and
for each of the T number of contrasts, phase encoding lines collected in one of the L number of channels corresponding to k-space positions which are same.

6. The method of claim 1, wherein training the convolution kernel of the respective phase encoding lines in the channel for the contrast comprises determining unknown parameters in a formula of the convolution kernel based on the L*T sets of central k-space data of the contrasts, wherein the central k-space data for each of the other contrasts is associated with the contrast by a respective weight, and
wherein determining uncollected k-space data in the channel comprises using the formula and the obtained k-space data in the L number of channels.

7. The method of claim 1, wherein training the convolution kernel of the respective phase encoding lines in the channel with the L*T sets of central k-space data of the contrasts comprises:
obtaining a plurality of equations based on the L*T sets of central k-space data $S'^t_j$ of the contrasts and a formula; and
determining parameters $n_{b_1}(j, t, l, m)$ and $n_{b_2}^v(j, t, l, m)$ based on the plurality of equations;
wherein, the formula is expressed as:

$$S_j^t(k_y - m\Delta k_y) = \sum_{l=1}^{L} \left( \sum_{b_1=0}^{N_{b_1}} n_{b_1}(j, t, l, m) S_l^t(k_y - b_1 A \Delta k_y) + \sum_{v=t-m,t+A=m}^{} \sum_{b_2=0}^{N_{b_2}-1} n_{b_2}^v(j, t, l, m) S_l^v(k_y - m\Delta k_y - b_2 A \Delta k_y) \right)$$

$k_y$ represents a phase encoding line;
$\Delta k_y$ represents a distance between two adjacent phase encoding lines;
A represents an acceleration factor, and $m \in \{1, 2, \ldots, A\}$;
$S_j^t(k_y - m \cdot \Delta k_y)$ represents data of a $(k_y - m \cdot \Delta k_y)$-th phase encoding line in a j-th channel for contrast t;
$S_l^t(k_y - b_1 A \Delta k_y)$ represents data of a $(k_y - b_1 A \Delta k_y)$-th phase encoding line in an l-th channel for contrast t;
$S_l^v(k_y - m \Delta k_y - b_2 A \Delta k_y)$ represents data of a $(k_y - m\Delta k_y - b_2 A \Delta k_y)$-th phase encoding line in the l-th channel for contrast v;
L represents a number of channels and is an integer greater than or equal to 2;
$N_{b_1}$ represents a number of blocks in a convolution kernel at the contrast t, wherein a block is defined as a combination of a single collected phase coding line and (A-1) missing phase coding lines within contrast t;
$N_{b_2}$ represents a number of blocks in a convolution kernel at the contrast v, wherein a block is defined as a combination of a single collected phase coding line and (A-1) missing phase coding lines within contrast v;
$n_{b_1}(j, t, l, m)$ represents a weight corresponding to the data of the $(k_y - b_1 A \Delta k_y)$-th phase encoding line in the l-th channel for block $b_1$ in the convolution kernel at contrast t;
$n_{b_2}^v(j, t, l, m)$ represents a weight of the data corresponding to the $(k_y - m\Delta k_y - b_2 A \Delta k_y)$-th phase encoding line in the l-th channel for block $b_2$ in the convolution kernel at contrast v;
l represents a channel index;
j represents a channel index;
$b_1$ represents an index of each block in the convolution kernel at contrast t;
$b_2$ represents an index of each block in the convolution kernel at contrast v; and
v represents a contrast index.

8. The method of claim 1, wherein the undersampling manner comprises a non-equidistant undersampling manner.

9. The method of claim 8, wherein training the convolution kernel of the respective phase encoding lines in the channel with the L*T sets of central k-space data comprises:
respectively training the convolution kernel of the respective phase encoding lines in the channel with the L*T sets of central k-space data via iterative convolution.

10. The method of claim 1, wherein scanning the subject in the undersampling manner comprises scanning k-space peripheral region of the subject, and
wherein the k-space peripheral region refers to a region other than the k-space central region in the k-space.

11. A device for reconstructing magnetic resonance images for contrasts, comprising:
at least one processor; and
at least one non-transitory machine-readable storage medium coupled to the at least one processor having machine-executable instructions stored thereon that, when executed by the at least one processor, cause the at least one processor to perform operations comprising:
collecting respective magnetic resonance signal data for T number of contrasts by scanning a subject with L number of channels in an undersampling manner so as to obtain L*T sets of k-space data $S_j^t$, wherein, $t \in \{1, 2, 3, \ldots, T\}, l \in \{1, 2, 3, \ldots, L\}$, T is an integer greater than or equal to 2 and L is an integer greater than or equal to 2;
collecting respective central k-space magnetic resonance signal data for the T number of contrasts by scanning a k-space central region of the subject with the L number of channels in a fullsampling manner so as to obtain L*T sets of central k-space data $S'^t_j$;
for each of the L number of channels for each of the T number of contrasts,
training a convolution kernel of respective phase encoding lines in the channel based on the L*T sets of central k-space data of the contrasts;
determining uncollected k-space data in the channel by combining the convolution kernel of the respective phase encoding lines in the channel with the obtained k-space data in the L number of channels that is collected in the undersampling manner or the fullsampling manner or both, so as to obtain entire k-space data in the channel; and
obtaining a respective magnetic resonance image for each of the T number of contrasts by performing image reconstruction based on the entire k-space data in each of the L number of channels for the contrast.

12. The device of claim 11, wherein the operations further comprise:
simultaneously performing the scanning of the subject in the undersampling manner and the scanning of the k-space central region of the subject in the fullsampling manner.

13. The device of claim 11, wherein said machine executable instructions further cause the processor to:
separately performing the scanning of the subject in the undersampling manner and the scanning of the k-space central region of the subject in the fullsampling manner.

14. The device of claim 11, wherein the undersampling manner comprises an equidistant undersampling manner.

15. The device of claim 14, wherein the equidistant undersampling manner comprises one of the following:
for at least two of the T number of contrasts, phase encoding lines collected in one of the L number of channels corresponding to k-space positions which are not exactly same; and
for each of the T number of contrasts, phase encoding lines collected in one of the L number of channels corresponding to k-space positions which are same.

16. The device of claim 11, wherein training the convolution kernel of the respective phase encoding lines in the channel for the contrast comprises determining unknown parameters in a formula of the convolution kernel based on the L*T sets of central k-space data of the contrasts, wherein the central k-space data for each of the other contrasts is associated with the contrast by a respective weight, and
wherein determining uncollected k-space data in the channel comprises using the formula and the obtained k-space data in the L number of channels.

17. The device of claim 11, wherein when training the convolution kernel of the respective phase encoding lines in the channel with the L*T sets of central k-space data of the contrasts comprises:
obtaining a plurality of equations based on the L*T sets of central k-space data $S'^t_l$ of the contrasts and a formula; and
determining parameters $n_{b_1}(j, t, l, m)$ and $n_{b_2}^v(j, t, l, m)$ based on the plurality of equations;
wherein, the formula is expressed as:

$$S_j^t(k_y - m\Delta k_y) = \sum_{l=1}^{L} \left( \sum_{b_1=0}^{N_{b_1}} n_{b_1}(j, t, l, m) S_l^t(k_y - b_1 A \Delta k_y) + \sum_{v=t-m, t+A=m}^{} \sum_{b_2=0}^{N_{b_2}-1} n_{b_2}^v(j, t, l, m) S_l^v(k_y - m\Delta k_y - b_2 A \Delta k_y) \right)$$

k represents a phase encoding line;
$\Delta k_y$ represents a distance between two adjacent phase encoding lines;
A represents an acceleration factor, and $m \in \{1, 2, \ldots, A\}$;
$S_j^t(k_y - m \cdot \Delta k_y)$ represents data of a $(k_y - m \cdot \Delta k_y)$-th phase encoding line in a j-th channel for contrast t;
$S_l^t(k_y - b_1 A \Delta k_y)$ represents data of a $(k_y - b_1 A \Delta k_y)$-th phase encoding line in a l-th channel for contrast t;
$S_l^v(k_y - m\Delta k_y - b_2 A \Delta k_y)$ represents data of a $(k_y - m\Delta k_y - b_2 A \Delta k_y)$-th phase encoding line in the l-th channel for contrast v;
L represents a number of channels and is an integer greater than or equal to 2;
$N_{b_1}$ represents a number of blocks in a convolution kernel at the contrast t, wherein a block is defined as a combination of a single collected phase coding line and (A-1) missing phase coding lines within contrast t;
$N_{b_2}$ represents a number of blocks in a convolution kernel at the contrast v, wherein a block is defined as a combination of a single collected phase coding line and (A-1) missing phase coding lines within contrast v;
$n_{b_1}(j, t, l, m)$ represents a weight corresponding to the data of the $(k_y - b_1 A \Delta k_y)$-th phase encoding line in the l-th channel for a block $b_1$ in the convolution kernel at contrast t;
$n_{b_2}^v(j, t, l, m)$ represents a weight of the data corresponding to the $(k_y - m\Delta k_y - b_2 A \Delta k_y)$-th phase encoding line in the l-th channel for a block $b_2$ in the convolution kernel at contrast v;
l represents a channel index;
j represents a channel index;
$b_1$ represents an index of each block in the convolution kernel at contrast t;
$b_2$ represents an index of each block in the convolution kernel at contrast v; and
v represents a contrast index.

18. The device of claim 11, wherein the undersampling manner comprises a non-equidistant undersampling manner.

19. The device of claim 11, wherein training the convolution kernel of the respective phase encoding lines in the channel with the L*T sets of central k-space data comprises:
respectively train the convolution kernel of the respective phase encoding lines in the channel with the L*T sets of central k-space data via iterative convolution.

20. The device of claim 11, wherein scanning the subject in the undersampling manner comprises scanning k-space peripheral region of the subject, and
wherein the k-space peripheral region refers to a region other than the k-space central region in the k-space.

* * * * *